(12) United States Patent
Zhou et al.

(10) Patent No.: US 10,986,745 B2
(45) Date of Patent: Apr. 20, 2021

(54) INSULATED HOUSING HAVING A CYLINDRICAL STRUCTURE

(71) Applicant: Delta Electronics, Inc., Taoyuan (CN)

(72) Inventors: Wei Zhou, Taoyuan (CN); Yicong Xie, Taoyuan (CN); Weiqiang Zhang, Taoyuan (CN)

(73) Assignee: Delta Electronics, Inc., Taoyuan (CN)

( * ) Notice: Subject to any disclaimer, the term of this patent is extended or adjusted under 35 U.S.C. 154(b) by 0 days.

(21) Appl. No.: 16/564,146

(22) Filed: Sep. 9, 2019

(65) Prior Publication Data
US 2020/0093017 A1  Mar. 19, 2020

(30) Foreign Application Priority Data
Sep. 18, 2018 (CN) .......................... 201811085791.7

(51) Int. Cl.
*H05K 5/04* (2006.01)
*H01B 17/62* (2006.01)
*H05K 5/02* (2006.01)

(52) U.S. Cl.
CPC ............... *H05K 5/04* (2013.01); *H01B 17/62* (2013.01); *H05K 5/0217* (2013.01); *H05K 5/0247* (2013.01)

(58) Field of Classification Search
CPC ... H05K 7/14; H05K 5/02; H05K 9/00; H01B 17/64
USPC ......................................................... 174/559
See application file for complete search history.

(56) References Cited

U.S. PATENT DOCUMENTS 6,163,457 A * 12/2000 Berth .................... H05K 7/1432
                                                                   361/704
2019/0157031 A1* 5/2019 Su .......................... H01H 83/20

FOREIGN PATENT DOCUMENTS

| CN | 205692673 U | 11/2016 |
| CN | 107611921 A | 1/2018 |
| CN | 20703829 U | 2/2018 |
| CN | 207601230 U | 7/2018 |
| EP | 2701476 A1 | 2/2014 |
| EP | 2701477 A1 | 2/2014 |
| JP | H1154938 A | 2/1999 |
| JP | 2009135384 A | 6/2009 |

(Continued)

OTHER PUBLICATIONS

The CN1OA issued Jul. 8, 2020 by the CNIPA.
The EESR issued Feb. 5, 2020 by the EPO.

*Primary Examiner* — Timothy J Thompson
*Assistant Examiner* — Michael F McAllister
(74) *Attorney, Agent, or Firm* — Qinghong Xu

(57) ABSTRACT

An insulated housing, in a cylindrical structure, includes an inner metal layer, an insulating layer and an outer metal coating. The insulating layer is positioned between the inner metal layer and the outer metal coating. In any end of the cylindrical structure, both a distance from the end of the inner metal layer to the end of the cylindrical structure and a distance from the end of the outer metal coating to the end of the cylindrical structure are not equal to zero, and the distance from the end of the inner metal layer to the end of the cylindrical structure is larger than the distance from an end of the outer metal coating to the end of the cylindrical structure. The inner metal layer is composed of one first metal cylinder and two second metal cylinders respectively disposed on the both ends of the first metal cylinder.

20 Claims, 10 Drawing Sheets

(56) References Cited

FOREIGN PATENT DOCUMENTS

WO      2014038000 A1    3/2014
WO      2015132128 A1    9/2015

* cited by examiner

INSULATED HOUSING HAVING A CYLINDRICAL STRUCTURE

CROSS-REFERENCE TO RELATED APPLICATIONS

This application is based upon and claims priority to Chinese Patent Application No. 201811085791.7, fled on Sep. 18, 2018, the entire contents thereof are incorporated herein by reference.

TECHNICAL FIELD

The present disclosure relates to a power electronic technical field, and in particular to an insulated housing.

BACKGROUND

With development of smart grids, high-power power electronic converters begin to be widely used in a field of new power supply, such as power quality control, energy storage, power transmission and solar energy, and wind power. In a medium-voltage system, insulation and protection of equipment are extremely important for safety and reliability of the system.

A medium-voltage insulated housing plays a role of insulation, shielding, support, heat dissipation and protection in the medium voltage system. The medium-voltage insulated housing has a power electronic device placed therein. Due to electrical shielding inside the housing, an insulating distance between the respective device and the air or various potential conductors is reduced, so that the product may be made more compact and the space layout is more reasonable. So, the medium-pressure insulated housing needs electrical reliability and also sufficient mechanical strength.

However, in the existing medium-pressure insulated housing, an end portion where an inner metal layer and an insulating layer intersect is prone to partial discharge, and the insulating layer is easily cracked.

Those contents as disclosed in the Background portion are merely used to reinforce understanding of the background technology of the present disclosure, accordingly the Background portion may include information that does not constitute the related art as already known by an ordinary person skilled in the art.

SUMMARY

An object of the present disclosure is to provide an insulated housing, at least to some extent, to overcome one or more problems caused due to limitations and disadvantages of the related art.

Other features and advantages of the present disclosure will become obvious from the below detailed description, or may be learned partially from practice of the present disclosure.

According to an exemplary implementation of the present disclosure, an insulated housing having a cylindrical structure, includes an inner metal layer, an insulating layer and an outer metal coating, the insulating layer being positioned between the inner metal layer and the outer metal coating, wherein in any end of the cylindrical structure, a distance from an end of the inner metal layer to the end of the cylindrical structure and a distance from an end of the outer metal coating to the cylindrical structure are not equal to zero; and the distance from the end of the inner metal layer to the end of the cylindrical structure is larger than the distance from the end of the outer metal coating to the end of the cylindrical structure; and the inner metal layer is composed of one first metal cylinder and two second metal cylinders respectively disposed on the two ends of the first metal cylinder; the first metal cylinder and the second metal cylinders are in equipotential connection; an inner dimension of any one of the second metal cylinders is larger than or equal to an inner dimension of the first metal cylinder; and at least one part of any one of the second metal cylinders is immersed in the insulating layer.

According to some exemplary implementations of the present disclosure, the partial discharge starting voltage of the insulated housing may be increased by immersing at least one part of the second metal cylinder in the insulating layer.

According to some exemplary implementations of the present disclosure, the inner metal layer is of a porous structure, and the outer surface of the insulating layer is coated with the outer metal coating, which alleviate the thermal stress of the insulating layer after being heated and avoid cracking of the insulating layer.

According to some exemplary implementations of the present disclosure, the inner metal layer has a simple processing process, a short cycle, and is convenient for mass production.

According to some exemplary implementations of the present disclosure, the thickness of the middle portion of the insulating layer is less than the thickness of both ends of the insulating layer, which may reduce the weight.

According to some other implementations of the present disclosure, the groove surrounding the cylindrical structure is provided on the surface of the any end of the insulating layer covered by the outer metal coating, which may improve the partial discharge starting voltage of the insulated housing, and also may reduce the distance from the end of the outer metal coating to the end of the inner metal layer.

It should be understood that both the foregoing general description and the following detailed description of the present disclosure are exemplary, and cannot construed as limiting the present disclosure.

BRIEF DESCRIPTION OF THE DRAWINGS

The various objects, features and advantages of the present disclosure will be apparent according to the detailed description of the exemplary embodiments with reference to the accompanying drawings.

DETAILED DESCRIPTION

Figure 1:
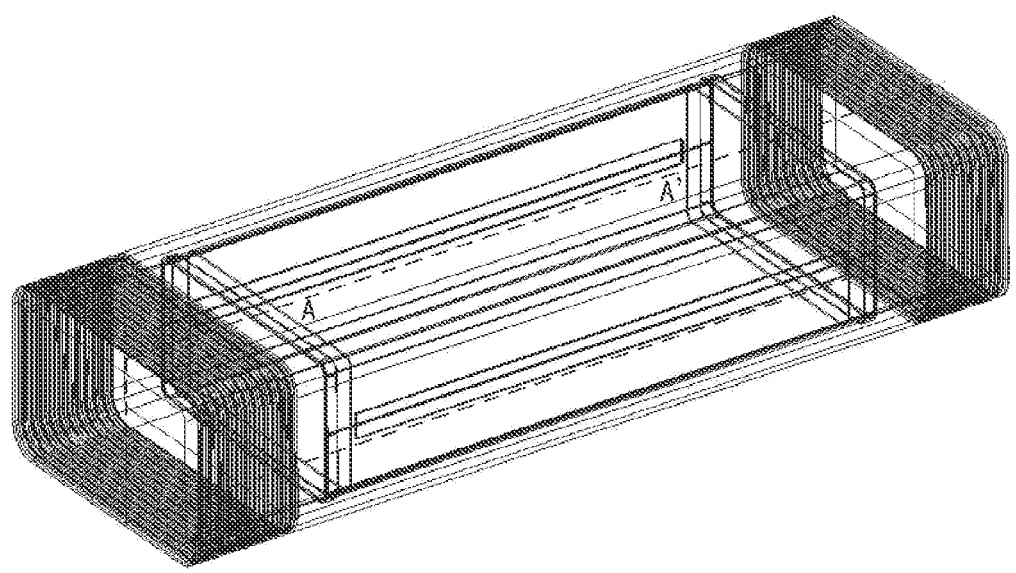
FIG. 1 shows a perspective view of an insulated housing according to one embodiment of the present disclosure.

Now, the exemplary embodiments will be described more fully with reference to the accompanying drawings. However, the exemplary embodiments can be implemented in various forms and should not be construed as limiting the embodiments as set forth herein. Instead, these exemplary implementations are provided such that the present disclosure will be described more fully and completely, and concept of the exemplary implementations will completely conveyed to those skilled in the art. The figures of the present disclosure are only illustrative, but not necessarily to be scaled in proportion. The same or similar parts in the drawings are shown in the same reference number, and accordingly the repeated description thereof will be omitted.

Furthermore, the features, structures, or characteristics may be combined in one or more exemplary implementations in any proper manner. Hereinafter, plenty of specific details are set forth in order to facilitate fully understanding the exemplary implementations of the present disclosure. It is aware that those skilled in the art may carry out the technical solutions of the present disclosure even through one or more of the special details are omitted, or by employing other methods, components, and steps, etc. In other instances, the well-known structures, methods, implementations, or operations are not shown or described in detail to avoid obscuring aspects of the present disclosure.

An embodiment of the present disclosure provides an insulated housing, as presented in a cylindrical structure, including an inner metal layer, an insulating layer and an outer metal coating. The insulating layer is positioned between the inner metal layer and the outer metal coating. In any end of the cylindrical structure, both a distance from the end of the inner metal layer to the end of the cylindrical structure and a distance from the end of the outer metal coating to the end of the cylindrical structure are not equal to zero, and the distance from the end of the inner metal layer to the end of the cylindrical structure is larger than the distance from an end of the outer metal coating to the end of the cylindrical structure. The inner metal layer is composed of one first metal cylinder and two second metal cylinders respectively disposed on the both ends of the first metal cylinder. The first metal cylinder and the second metal cylinders are in equipotential connection. An inner dimension of any one of the second metal cylinders is larger than or equal to an inner dimension of the first metal cylinder. At least one part of any one of the second metal cylinders is immersed in the insulating layer. The partial discharge starting voltage of the insulated housing may be improved by immersing the second metal cylinder in the insulating layer. And, the inner metal layer has a simple processing process, a short manufacturing cycle, and is convenient for mass production.

Figure 2:
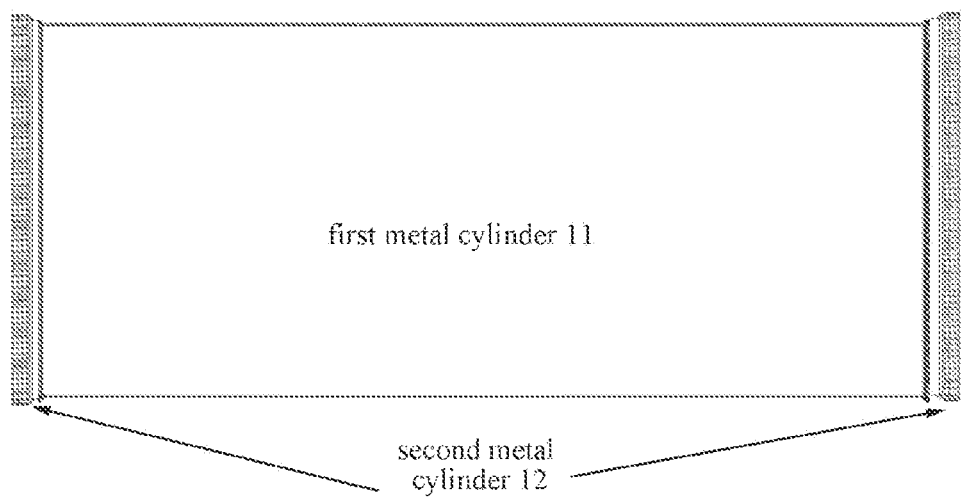
FIG. 2 shows a schematic view of an inner metal layer of the insulated housing according to one embodiment of the present disclosure.
Figure 3:
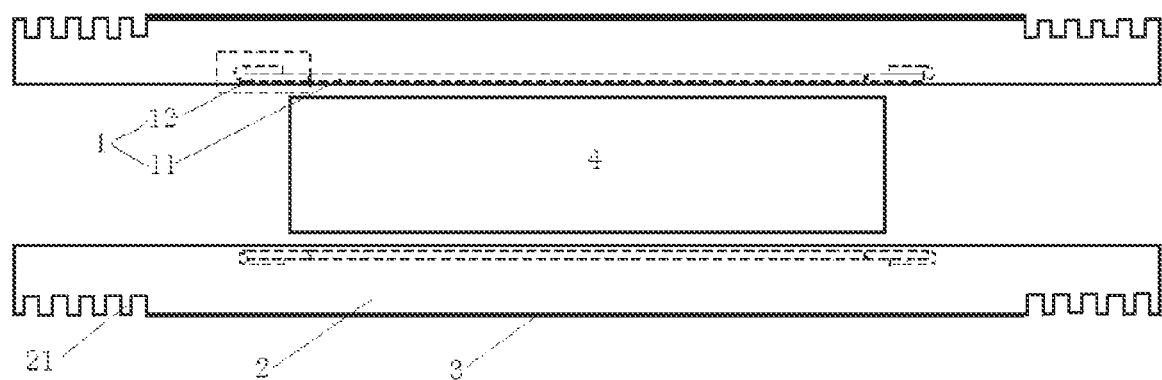
FIG. 3 is a cross-sectional view as taken along a line A-A' of FIG. 1.
Figure 4A:
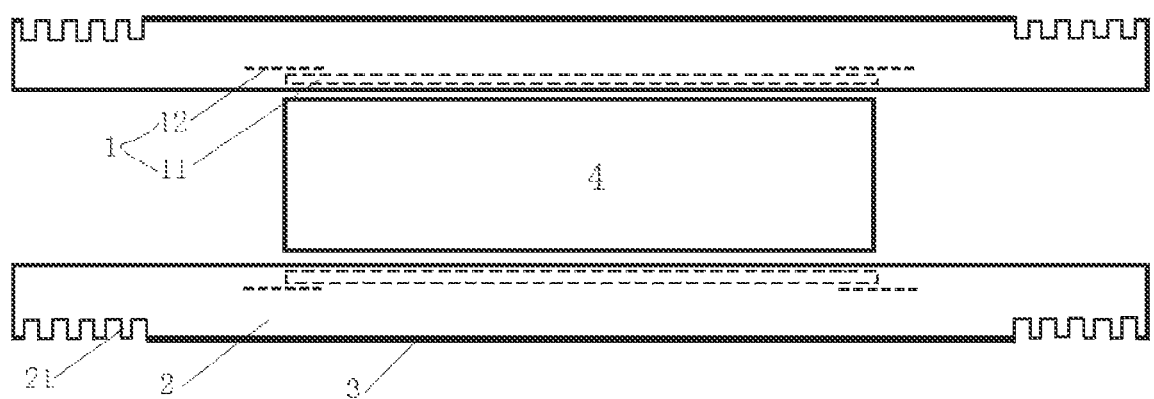
FIGS. 4A-4C are cross-sectional views showing an insulated housing according to another exemplary implementation of the present disclosure.
Figure 4B:
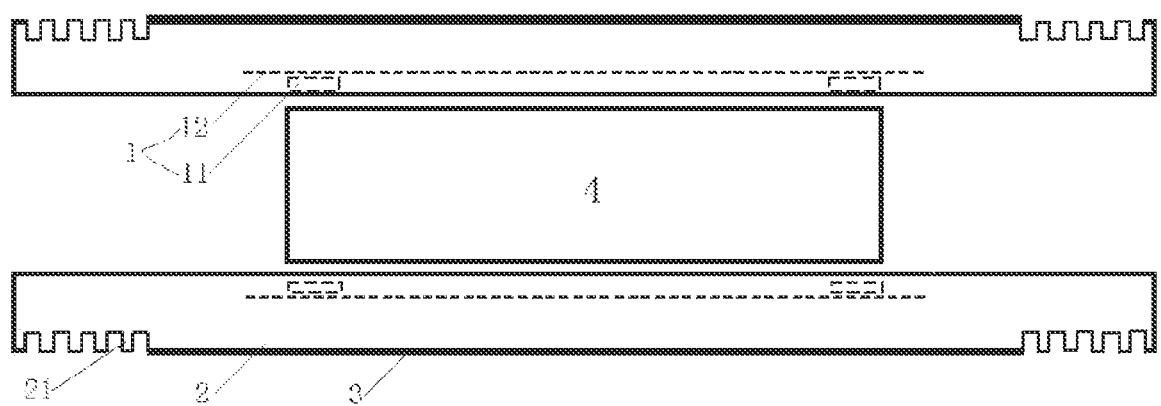
Figure 4C:
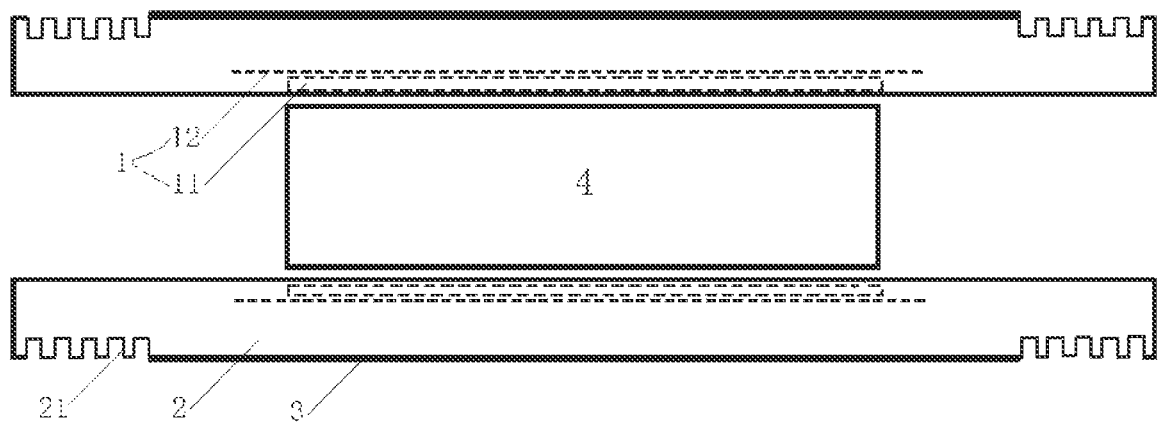
Figure 5A:
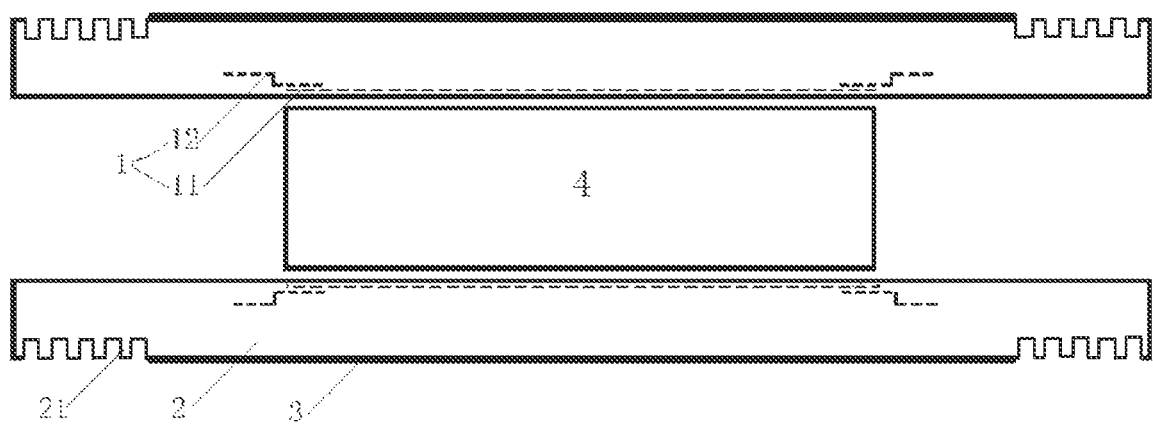
FIGS. 5A-5B are cross-sectional views showing an insulated housing according to a further exemplary implementation of the present disclosure.
Figure 5B:
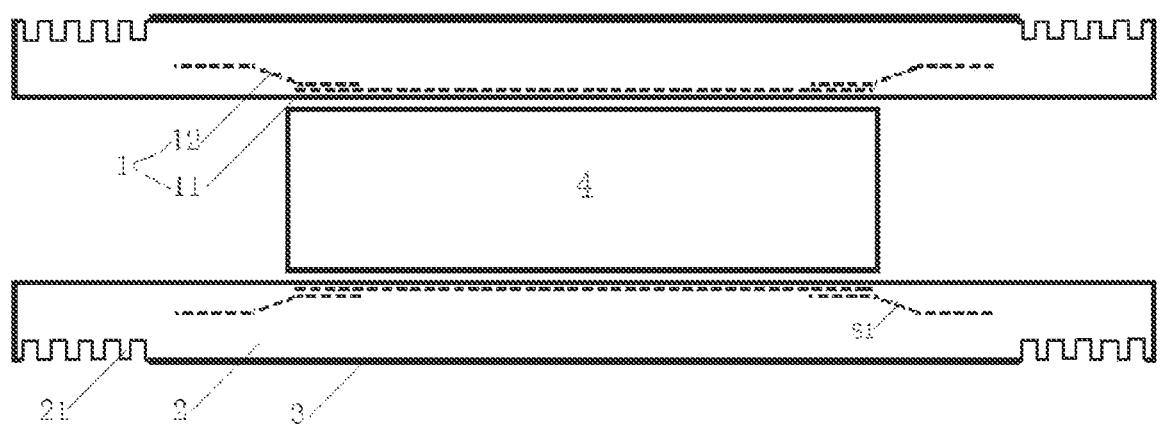
Figure 6:
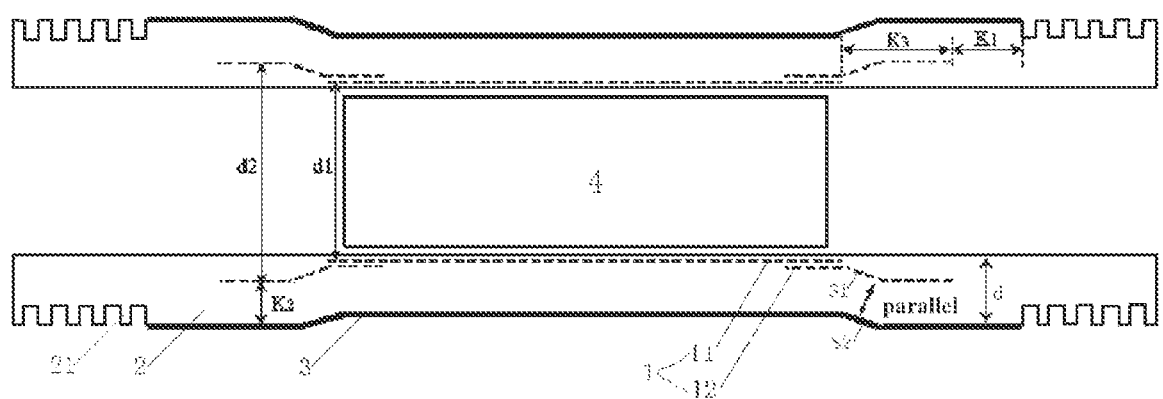
FIG. 6 is a cross-sectional view showing an insulated housing according to a further exemplary implementation of the present disclosure.
Figure 7:
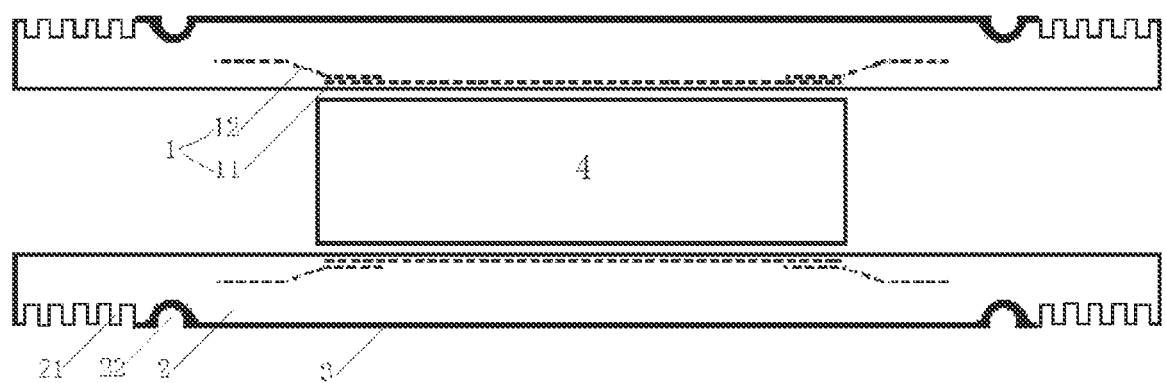
FIG. 7 is a cross-sectional view showing an insulated housing according to a further exemplary implementation of the present disclosure.

Hereinafter, the insulated housing of the present disclosure will be described in detail with reference to FIGS. 1-7. FIG. 1 shows a perspective view of the insulated housing according to one embodiment of the present disclosure. FIG. 2 shows a schematic view of the inner metal layer of the insulated housing according to one embodiment of the present disclosure. FIG. 3 is a cross-sectional view taken along the line A-A' of FIG. 1. FIGS. 4A-4C are cross-sectional views showing the insulated housing according to another exemplary implementation of the present disclosure. FIGS. 5A-5B are cross-sectional views showing an insulated housing according to a further exemplary implementation of the present disclosure. FIG. 6 is a cross-sectional view showing the insulated housing according to a further exemplary implementation of the present disclosure. FIG. 7 is a cross-sectional view showing an insulated housing according to a further exemplary implementation of the present disclosure.

As shown in FIG. 1-3, the insulated housing, as presented in a cylindrical structure, includes an inner metal layer 1, an insulating layer 2 and an outer metal coating 3. The insulating layer is positioned between the inner metal layer 1 and the outer metal coating 3. In any end of the cylindrical structure, both the distance from the end of the inner metal layer to the end of the cylindrical structure and the distance from the end of the outer metal coating to the end of the cylindrical structure are not equal to zero, and the distance from the end of the inner metal layer to the end of the cylindrical structure is larger than the distance from the end of the outer metal coating to the end of the cylindrical structure. The inner metal layer 1 is composed of one first metal cylinder 11 and two second metal cylinders 12 respectively disposed on the both ends of the first metal cylinder 11. The first metal cylinder and the second metal cylinders are in equipotential connection. An inner dimension of any one of the second metal cylinders is larger than or equal to an inner dimension of the first metal cylinder, and an outer dimension of any one of the second metal cylinders 12 is larger than an outer dimension of the first metal cylinder 11. At least one part of any one of the second metal cylinders 12 is immersed in the insulating layer. A power module 4 may be received in the insulated housing. The partial discharge starting voltage of the insulated housing may be improved by immersing at least one part of the second metal cylinders in the insulating layer.

According to one exemplary implementation of the present disclosure, in any end of the cylindrical structure, the insulating layer has an umbrella-skirt structure 21 on its end, and the umbrella-skirt structure is not covered by the outer metal coating.

According to one exemplary implementation of the present disclosure, one of the ends of the second metal cylinders adjacent the end of the cylindrical structure has an outwardly curled edge.

According to one exemplary implementation of the present disclosure, the first or second metal cylinder is of a porous structure.

Specifically, as shown in FIG. 3, in the insulated housing, each of the first and second metal cylinders may be made of a porous plate. The ends of the second metal cylinder are curled and embedded in the insulating layer. For both ends of the insulating layer, at least one of the inner and outer sides has a umbrella-skirt structure, that is to say, although FIG. 3 shows such a circumstance that the outer sides of the two ends of the insulating layer have the umbrella-skirt structure, which the present disclosure is not limited thereto, there still has such a circumstance that the inner sides of the two ends of the insulating layer have the umbrella-skirt structure or both the inner and outer sides of the two ends of the insulating layer have the umbrella-skirt structure.

Based on the insulated housing of the exemplary implementation as shown in FIG. 3, the first metal cylinder and the second metal cylinder are of porous structure, which may alleviate thermal stress of the insulating layer and avoid crack of the insulating layer. And, the partial discharge starting voltage of the insulated housing can be improved by increasing a curvature radius because of curling and by using the insulating layer material with high dielectric strength. In addition, the umbrella-skirt structure may increase a creepage distance on the surface of the insulating layer.

According to one exemplary implementation of the present disclosure, the first or second metal cylinder may be made of a wire mesh.

According to one exemplary implementation of the present disclosure, the first or second metal cylinder is composed of a plurality of metal rings arranged in series along an axial direction of the cylindrical structure.

According to one exemplary implementation of the present disclosure, any one of the second metal cylinder includes a first end and a second end, wherein the first ends of the second metal cylinders are respectively covered to the outer surface of the corresponding end of the two ends of the first metal cylinder.

Specifically, as shown in FIGS. 4A-4C, in the insulated housing, the first metal cylinder may be enclosed by an integral porous plate, and the second metal cylinders may be enclosed by wire meshes partially and respectively distributed on the two ends of the first metal cylinder (as shown in FIG. 4A); or the first metal cylinder may be enclosed by a porous plate partially, and the second metal cylinders may be enclosed by the integral wire meshes (as shown in FIG. 4B); or the first metal cylinder may be enclosed by the integral porous plate, and the second metal cylinders may be enclosed by the integral wire meshes (as shown in FIG. 4C). In the exemplary implementations of FIGS. 4A-4C, the porous plate has a certain thickness, and the second metal cylinders are sleeved to the first metal cylinder, so that the second metal cylinders may be completely immersed in the insulating layer.

Based on the insulated housing of the exemplary implementation as shown in FIGS. 4A-4C, the first metal cylinder has a porous plate structure, and the second metal cylinders have a mesh structure to alleviate the thermal stress of the insulating layer and avoid crack of the insulating layer. And the partial discharge starting voltage of the insulated housing may be improved by immersing the second metal cylinders completely in the insulating layer (by use of the high dielectric strength of the insulating layer material). In some other embodiments of the present disclosure, similar to FIG. 4B, the first metal cylinder is composed of two or more metal rings spaced apart and sequentially arranged along the axial direction of the cylindrical structure, to further alleviate the thermal stress of the insulating layer. And the spaced distance between the metal rings may be equal.

According to one exemplary implementation of the present disclosure, the first ends of the two second metal cylinders are connected with each other and are integrally formed, that is to say, the two second metal cylinders in fact have been integrally connected to form a metal cylinder (as shown in FIGS. 4B-4C).

According to one exemplary implementation of the present disclosure, the inner dimension of the second end of the second metal cylinder is larger than or equal to the inner dimension of the first end of the second metal cylinder.

According to one exemplary implementation of the present disclosure, the inner dimension of the second end of the second metal cylinder is larger than the inner dimension of the first end of the second metal cylinder, and the second end and the first end of the second metal cylinder have a right angle transition therebetween.

According to one exemplary implementation of the present disclosure, the inner dimension of the second end of the second metal cylinder is larger than the inner dimension of the first end of the second metal cylinder, and the second end and the first end of the second metal cylinder have a chamfer transition to form a first transition surface.

Specifically, as shown in FIGS. 5A-5B, in the insulated housing, the first metal cylinder and the second metal cylinder may be enclosed by wire meshes, and the second metal cylinders are distributed on the two ends of the first metal cylinder, respectively. The second metal cylinder employs a right angle transition (as shown in FIG. 5A) or a chamfer transition, to form a first transition surface S1 (as shown in FIG. 5B). At least one part of the second metal cylinder is immersed in the insulating layer.

Based on the insulated housing of the exemplary implementation as shown in FIGS. 5A-5B, the first and second metal cylinders both have a wire mesh structure, so that the weight of the insulated housing may be further reduced. Meanwhile, the inner dimension of the second end of the second metal cylinder is larger than the inner dimension of the first end of the second metal cylinder to avoid electric field concentration in the partial area. In addition, the second metal cylinder is at least partially immersed in the insulating layer, which improves the partial discharge starting voltage of the insulated housing.

According to one exemplary implementation of the present disclosure, the thickness of the middle portion of the insulating layer is less than the thickness of both ends of the insulating layer.

According to one exemplary implementation of the present disclosure, in the portion of the insulating layer covered by the outer metal coating, the thickness of the middle portion is less than the thickness of both ends of the insulating layer, and there is a second transition surface S2 respectively between the middle portion and the two ends of the insulating layer. The second transition surface of the insulating layer is parallel to the first transition surface of the second metal cylinder.

Specifically, as shown in FIG. 6, in the insulated housing, the thickness of the middle portion of the insulating layer is less than the thickness of both ends of the insulating layer, which can reduce the overall weight of the insulated housing. The transition area of the second metal cylinder (i.e., the first transition surface S1) and the transition area of the insulating layer/the outer metal coating (i.e., the second transition surface S2) are parallel to each other, and smoothly transitioned, which may avoid partial electric field concentration and improve the partial discharge starting voltage and withstand voltage of the insulated housing.

Further, the insulated housing of the exemplary implementation as shown in FIG. 6 may be defined as follows: the inner dimension of the first metal cylinder is smaller than the inner dimension of the second metal cylinder, that is, $d1<d2$ the minimum distance between the end of the first metal cylinder and the end of the outer metal coating is presented as $K1>1.6*Up$ (Up is a design voltage of the partial discharge of a product), the minimum distance between the outer surface of the second metal cylinder and the inner surface of the outer metal coating is presented as K2: $0.6*d<K2<0.8*d$, wherein d is the maximum thickness of the insulating layer; the minimum distance between the end of the second metal cylinder and the end of the first metal cylinder is presented as $K3>0.25*Up$.

According to one exemplary implementation of the present disclosure, the cylindrical structure is a cylinder.

According to one exemplary implementation of the present disclosure, the cylindrical structure is a rectangular cylinder.

According to one exemplary implementation of the present disclosure, the cylindrical structure has a length of 800-1200 mm, and the insulating layer has a thickness of 8-22 mm. In any end of the cylindrical structure, the minimum distance between the end of the inner metal layer and the end of the outer metal coating is K1=10-60 mm, to which the present disclosure is not limited, and also may be a dimension without the above numeral range depending on actual usage of the product. According to one exemplary implementation of the present disclosure, the outer metal coating is an outer zinc spraying layer. The metal coating is provided on the outside, which may avoid shortcomings probably caused by the outer metal plate, that is, the outer metal plate easily restricts inflation and contraction of the insulating layer. After cold and heat circulation experiment or long-term heating, the insulating layer may be peeled from the outer metal plate (for example, an aluminum plate housing), and the insulating layer at the connection with the outer metal plate has a risk of cracking.

According to one exemplary implementation of the present disclosure, the inner metal layer is composed of stainless steel, copper or aluminum.

According to one exemplary implementation of the present disclosure, a groove 22 surrounding the cylindrical structure is provided on the surface of any end of the insulating layer covered by the outer metal coating, as shown in FIG. 7. Arrangement of the groove can avoid the electric field concentration on the ends of the outer metal coating, and improve the partial discharge starting voltage of the insulated housing, and also may reduce the distance from the end of the outer metal coating to the end of the inner metal layer.

According to one exemplary implementation of the present disclosure, an intersection line between the surface of the groove and any plane passing through the central axis of the cylindrical structure is an arc.

According to one exemplary implementation of the present disclosure, the arc is a circular arc.

As above described, those skilled in the art will readily appreciate that the insulated housing according to the embodiment of the present disclosure has one or more of the following advantages.

According to some exemplary implementations of the present disclosure, the partial discharge starting voltage of the insulated housing may be increased by immersing at least one part of the second metal cylinder in the insulating layer.

According to some exemplary implementations of the present disclosure, the inner metal layer is of a porous structure, and the outer surface of the insulating layer is coated with the outer metal coating, which alleviate the thermal stress of the insulating layer after being heated and avoid cracking of the insulating layer.

According to some exemplary implementations of the present disclosure, the inner metal layer has a simple processing process, a short cycle, and is convenient for mass production.

According to some exemplary implementations of the present disclosure, the thickness of the middle portion of the insulating layer is less than the thickness of both ends of the insulating layer, which may reduce the weight.

According to some other implementations of the present disclosure, the groove surrounding the cylindrical structure is provided on the surface of the any end of the insulating layer covered by the outer metal coating, which may improve the partial discharge starting voltage of the insulated housing, and also may reduce the distance from the end of the outer metal coating to the end of the inner metal layer.

Those skilled in the art, upon consideration of the specification and after practice of this disclosure, would easily conceive of the other embodiments of the present disclosure. The present disclosure is directed to encompass any variation, use or adaptive change, which accord to the general principles of the present disclosure and include common knowledge or the customary means in the art but not disclosed in the present disclosure. The specification and the embodiments are regarded to be illustrative only, and the scope and the spirit of the present disclosure is defined within the claims.

It should be understood that the present disclosure does not limit to the precise structure that has been described and shown in the drawings, and various modifications and alternations may be made without departing from the scope of this disclosure. The scope of the present disclosure is limited only by the appended claims.

What is claimed is:

1. An insulated housing having a cylindrical structure, comprising: an inner metal layer, an insulating layer and an outer metal coating, the insulating layer being positioned between the inner metal layer and the outer metal coating, wherein
    in any end of the cylindrical structure, a distance from an end of the inner metal layer to the end of the cylindrical structure and a distance from an end of the outer metal coating to the cylindrical structure are not equal to zero; and the distance from the end of the inner metal layer to the end of the cylindrical structure is larger than the distance from the end of the outer metal coating to the end of the cylindrical structure; and
    the inner metal layer is composed of one first metal cylinder and two second metal cylinders respectively disposed on the two ends of the first metal cylinder; the first metal cylinder and the second metal cylinders are in equipotential connection; an inner dimension of any one of the second metal cylinders is larger than or equal to an inner dimension of the first metal cylinder; and at least one part of any one of the second metal cylinders is immersed in the insulating layer.

2. The insulated housing having a cylindrical structure of claim 1, wherein in any end of the cylindrical structure, the insulating layer has an umbrella-skirt structure on its end, and the umbrella-skirt structure is not covered by the outer metal coating.

3. The insulated housing having a cylindrical structure of claim 1, wherein the first or second metal cylinder is of a porous structure.

4. The insulated housing having a cylindrical structure of claim 3, wherein the first or second metal cylinder is made of a wire mesh or made of a porous plate.

5. The insulated housing having a cylindrical structure of claim 1, wherein the first or second metal cylinder is comprised of a plurality of metal rings spaced apart and seguentially arranged along an axial direction of the cylindrical structure.

6. The insulated housing having a cylindrical structure of claim 1, wherein any one of the second metal cylinders comprises a first end and a second end, wherein the first end is covered to the outer surface of the corresponding one of the two ends of the first metal cylinder.

7. The insulated housing having a cylindrical structure of claim 6, wherein the inner dimension of the second end is larger than or equal to the inner dimension of the first end.

8. The insulated housing having a cylindrical structure of claim 7, wherein the inner dimension of the second end is larger than the inner dimension of the first end, and there is a right angle transition between the second end and the first end.

9. The insulated housing having a cylindrical structure of claim 7, wherein the inner dimension of the second end is larger than the inner dimension of the first end, and there is a chamfer transition between the second end and the first end, to form a first transition surface.

10. The insulated housing having a cylindrical structure of claim 6, wherein the first ends of the two second metal cylinders are connected with each other, and are integrally formed.

11. The insulated housing having a cylindrical structure of claim 1, wherein one of the ends of the second metal cylinders adjacent the end of the cylindrical structure has an outwardly curled edge.

12. The insulated housing having a cylindrical structure of claim 1, wherein the cylindrical structure is a rectangular cylinder.

13. The insulated housing having a cylindrical structure of claim 1, wherein the cylindrical structure has a length of 800-1200 mm, and the insulating layer has a thickness of 8-22 mm, and in any end of the cylindrical structure, the distance from the end of the inner metal layer to the end of the outer metal coating is 10-60 mm.

14. The insulated housing having a cylindrical structure of claim 1, wherein the outer metal coating is a zinc spraying layer.

15. The insulated housing having a cylindrical structure of claim 1, wherein the inner metal layer is made of stainless steel, copper or aluminum.

16. The insulated housing having a cylindrical structure of claim 1, wherein the thickness of the middle portion of the insulating layer is less than the thickness of the both ends of the insulating layer.

17. The insulated housing having a cylindrical structure of claim 9, wherein in a portion of the insulating layer covered by the outer metal coating: the thickness of the middle portion is less than the thickness of both ends: and there is a second transition surface between the middle portion and the two ends: respectively; and the second transition surface is parallel to the first transition surface.

18. The insulated housing having a cylindrical structure of claim 1, wherein a groove surrounding the cylindrical structure is provided on the surface of any end of the insulating layer covered by the outer metal coating.

19. The insulated housing having a cylindrical structure of claim 18, wherein an intersection line between the surface of the groove and any plane passing through the central axis of the cylindrical structure is an arc.

20. A power system comprising an insulated housing as defined in claim 1 and a power module received in the insulated housing.

* * * * *